US006369452B1

(12) United States Patent
Buchwalter et al.

(10) Patent No.: US 6,369,452 B1
(45) Date of Patent: Apr. 9, 2002

(54) CAP ATTACH SURFACE MODIFICATION FOR IMPROVED ADHESION

(75) Inventors: Stephen Leslie Buchwalter, Hopewell Junction, NY (US); Hung Manh Dang, Brossard (CA); Michael A. Gaynes, Vestal; Konstantinos I. Papathomas, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/361,723

(22) Filed: Jul. 27, 1999

(51) Int. Cl.$^7$ .................. H01L 23/48; H01L 23/52; H01L 29/40
(52) U.S. Cl. .................. 257/783; 257/750; 257/758
(58) Field of Search ............... 257/704, 750, 257/758, 783, 702, 703, 778, 757; 438/125, 652, 118, 622

(56) References Cited

U.S. PATENT DOCUMENTS

| | | | |
|---|---|---|---|
| 3,551,304 A | 12/1970 | Letter et al. ............ 205/162 |
| 4,952,904 A | 8/1990 | Johnson et al. ......... 257/757 |
| 4,965,660 A | * 10/1990 | Ogihara et al. ......... 257/704 |
| 5,399,805 A | * 3/1995 | Tyler et al. ............ 257/787 |
| 5,504,372 A | * 4/1996 | Braden et al. .......... 257/723 |
| 5,578,869 A | * 11/1996 | Hoffman et al. ........ 257/691 |
| 5,706,579 A | 1/1998 | Ross ................... 257/704 |
| 5,757,061 A | * 5/1998 | Satoh et al. ........... 257/303 |
| 5,760,480 A | 6/1998 | You et al. ............. 257/753 |
| 6,232,563 B1 | * 5/2001 | Kim et al. ............. 174/261 |

OTHER PUBLICATIONS

E.P. Plueddemann, Silane Coupling Agents, Plenum Press, 1982 (book).

* cited by examiner

Primary Examiner—Jhihan B Clark
(74) Attorney, Agent, or Firm—Schmeiser, Olsen & Watts; Lawrence R. Fraley

(57) ABSTRACT

An electronic structure bondable to an electronic assembly, such as a chip. The electronic structure may be joined to a electronic assembly, such as a chip, by use of a structural epoxy adhesive. The electronic structure includes a mineral layer on a metallic plate, and an adhesion promoter layer on the mineral layer. The metallic plate includes a metallic substance that includes a pure metal with or without a metal coating. The metallic substance may include such substances as stainless steel, aluminum, titanium, copper, copper coated with nickel, and copper coated with chrome. The mineral layer includes a chemical compound derived from a mineral; e.g., silicon dioxide ($SiO_2$) derived from quartz. Such chemical compounds may include such substances as silicon dioxide, silicon nitride, and silicon carbide. The chemical compound may exist in either crystalline or amorphous form. The adhesion promoter may include such chemical substances as silanes, titanates, zirconates, and aluminates.

13 Claims, 4 Drawing Sheets

CAP ATTACH SURFACE MODIFICATION FOR IMPROVED ADHESION

BACKGROUND OF THE INVENTION

1. Technical Field

The present invention relates to a structure, and associated method of formation, in which a metal plate is surface treated to facilitate adhesive bonding to the metal plate.

2. Related Art

In an electronic structure, bonding of an electronic assembly (such as a chip) to an electronic carrier (such as a chip carrier or circuit card) is typically characterized by a mismatch in thermal expansion coefficient (CTE) between the electronic assembly and the electronic carrier. As an example, a silicon chip may be adhesively coupled to an organic chip carrier by controlled collapse chip connection (C4) solder balls such that a thermally-cured rigid thermoset material encapsulates the C4 solder balls and mechanically couples the chip to the chip carrier. A silicon chip has a CTE typically in the range of 2 to 3 ppm/° C., while an organic chip carrier has a CTE typically in the range of 17 to 18 ppm/° C. With the organic chip carrier expanding and contracting thermally more than the chip, the mechanically coupled configuration responds to a temperature decrease from the cure temperature (e.g., 130° C.) of the rigid thermoset material by having the organic chip carrier bend concave downward in the direction away from the chip, thereby creating the shape of a "frown" in the chip carrier. Since the chip carrier may have a ball grid array (BGA) on its bottom side for attaching the chip carrier to a circuit card, the chip carrier's downward concavity represents a deviation from planarity that places stresses on the solder balls of the BGA. Such stresses may distort the shape of the BGA solder balls and subject the BGA solder balls to premature fatigue failure from thermal cycling.

A method currently employed to mitigate the aforementioned CTE mismatch problem utilizes a metallic plate (or cap), such as a stainless steel plate, placed in adhesive contact with both the top surface of the electronic assembly (e.g., chip) and the top surface of the electronic carrier (e.g., chip carrier). The adhesive contact may be accomplished by use of a thermally-cured structural adhesive. The arrangement of this method depends on using a metallic plate whose CTE mismatch with the electronic assembly is not very different from the CTE mismatch between the electronic assembly and the electronic carrier. For example, a stainless steel plate having a CTE of about 17 ppm/° C. may be placed in adhesive contact with a silicon chip having a CTE of about 2 to 3 ppm/° C. With the stainless steel plate thermally contracting and expanding more than the chip, the configuration responds to a temperature decrease from the cure temperature (e.g., 130° C.) of the structural adhesive by having the plate bend concave upward in the direction away from the chip, thereby creating the shape of a "smile" in the plate. The mechanical coupling between the plate and the chip, in concert with the mechanical coupling between the chip and the chip carrier, couples the thermal stresses in the plate to the chip carrier. As a result, the chip carrier is subject to oppositely directed stresses of comparable magnitude, namely the stress associated with the smile and the stress associated with the frown. These oppositely directed stresses cancel, leaving the chip carrier in a nearly planar (rather than curved) configuration. Due to the cancellation of opposing stresses, the resulting configuration is like a loaded spring that can "pop" if the plate should separate from the chip. Thus, the adhesion between the metallic plate and the electronic carrier (e.g., chip) must be strong and durable.

Direct adhesive bonding between a stainless steel plate and a silicon chip is not easily accomplished. A current method for facilitating adhesion between a stainless steel plate and a silicon chip includes: chemically cleaning organic debris from the plate surfaces, etching away a thin layer of stainless steel from a surface of the plate to increase surface roughness and promote subsequent adhesion, and adding a layer of an adhesion promoter, such as a silane, to the etched stainless steel surface. Then, the plate is adhesively bonded to both the chip and the chip carrier by use of a structural epoxy adhesive. Unfortunately, the aforementioned method of adhesive bonding does not reliably produce consistent results. In particular, the adhesion promoter leaves gaps in its coverage of the etched stainless steel surface. Additionally, the strength of the chemical bond between the adhesion promoter and the stainless steel surface diminishes with time. As a result, the plate may prematurely delaminate from the epoxy adhesive.

A method is needed for providing strong and durable adhesive coupling between a metallic cap and an electronic carrier.

SUMMARY OF THE INVENTION

The present invention provides an electronic structure, comprising: a metallic plate; a mineral layer bonded to the metallic plate; and an adhesion promoter layer bonded to the mineral layer.

The present invention also provides a method for forming an electronic structure, comprising: providing a metallic plate; forming a mineral layer on the metallic plate; and forming an adhesion promoter layer on the mineral layer.

The present invention has the advantage of providing a strong adhesive bond between a metallic plate and an electronic assembly. The present invention advantageously facilitates consistent and uniform coverage of the metallic plate by the adhesion promoter. The present invention has the added advantage of providing a mechanism for dissipating heat from an electronic assembly.

DETAILED DESCRIPTION OF THE INVENTION

Figure 1:
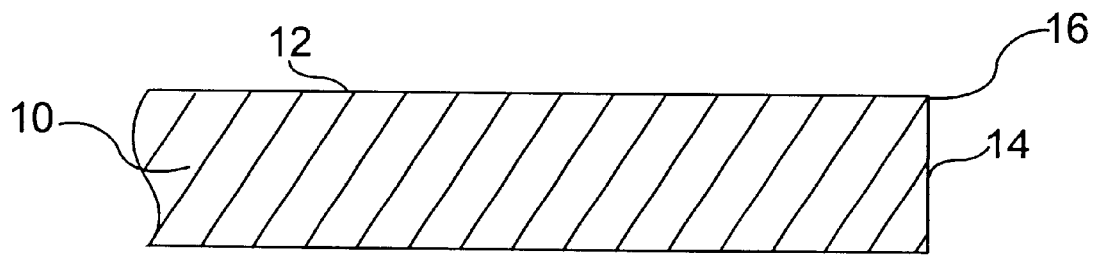
FIG. 1 depicts a side cross-sectional view of a metallic plate, in accordance with a preferred embodiment of the present invention.
Figure 5:
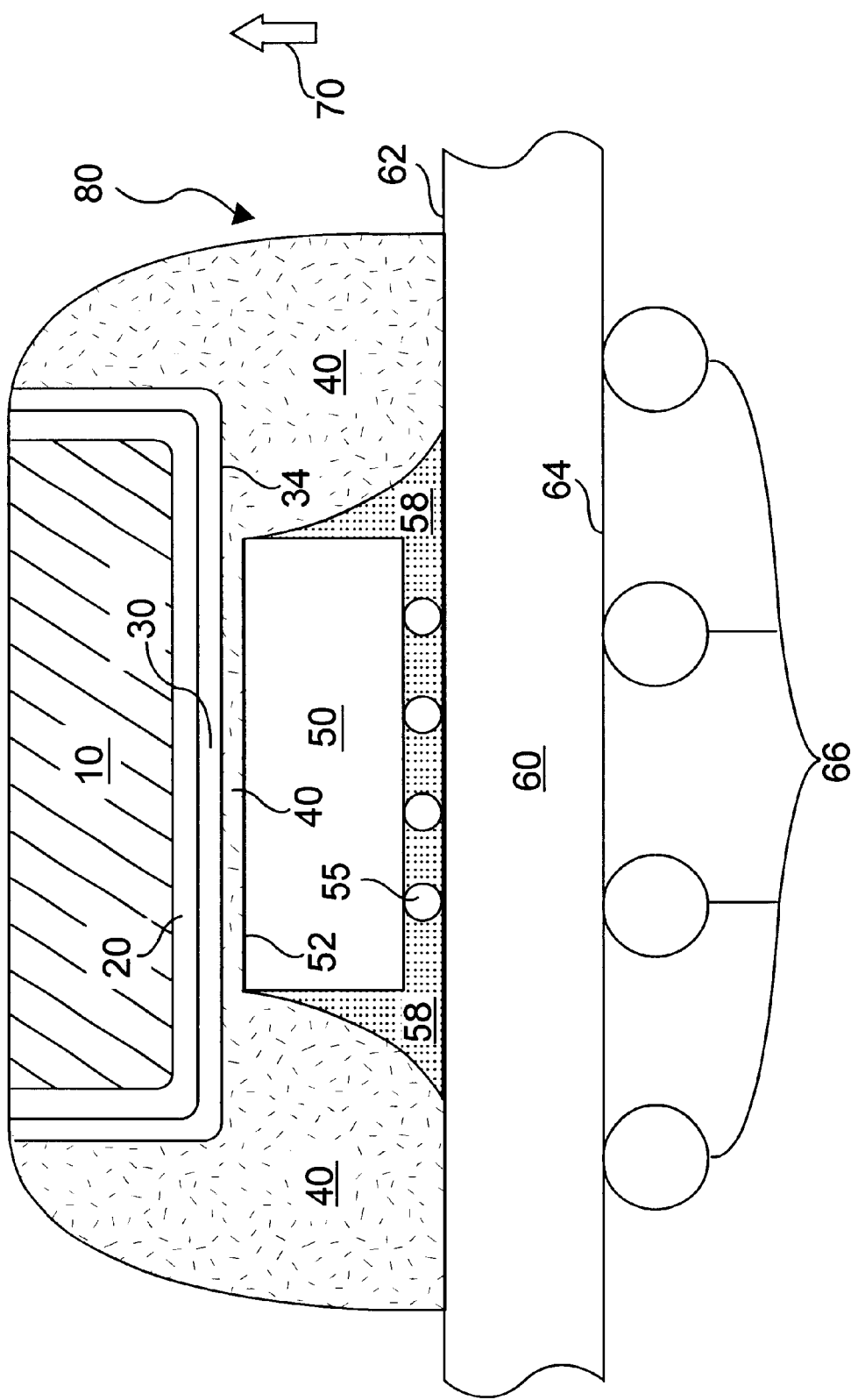
FIG. 5 depicts FIG. 4 with the metallic plate adhesively coupled to an electronic assembly and to an electronic carrier.

FIG. 1 illustrates a side cross-sectional view of a metallic plate 10 having a top surface 12 and an edge surface 14. The top surface 12 and the edge surface 14 meet at a corner 16. The metallic plate 10 includes a metallic substance that includes a metal with or without a metal coating. The metallic substance may include, inter alia, stainless steel, aluminum, titanium, copper, copper coated with nickel, and copper coated with chrome. The presence of metal in the metallic substance enables the metallic plate 10 to have sufficiently high thermal conductivity for effectively conducting heat out of an electronic assembly, such as a chip, that will be subsequently bonded to the plate. The metallic plate of the structure of the present invention may have any thickness consistent with both the elastic modulus of the metallic substance and the thickness of the electronic carrier (e.g., laminate chip carrier) to which the metallic plate 10 will subsequently be coupled (see FIG. 5 showing the metallic plate 10 coupled to the electronic carrier 60). The elastic modulus of the metallic substance and the thickness of the electronic carrier both relate to the force-balancing effectiveness of the metallic plate, as discussed supra in the "Related Art" section. For a stainless steel plate and a laminate chip carrier having a thickness between about 25 mils and about 35 mils, a plate thickness in a range of about 5 mils to about 7 mils is preferred. A plate thickness in a range of about 2 mils to about 20 mils is generally acceptable, depending on the elastic modulus of the metallic substance and the thickness of the electronic carrier.

It is preferred to initially clean the top surface 12, and the edge surface 14, of the metallic plate 10 in the following two steps. The first step chemically cleans the top surface 12 and the edge surface 14 to remove organic debris, such as oil. The second step sputter etches the top surface 12 and the edge surface 14 to remove a layer of the top surface 12 and the edge surface 14, respectively. While there are no inherent limitations on the thickness of the removed layers, tests have been conducted with sputter etching of stainless steel plates with removal thicknesses in a range of about 50 Å to about 1000 Å. Any known method of sputter etching may be used, such as sputter etching in a low-pressure chamber (e.g., $2 \times 10^{-4}$ psi) by directing a high-energy argon gas onto the top surface 12 and the edge surface 14 as the metallic plate 10 moves through the chamber on a conveyor belt. Alternatively, the metallic plate 10 may remain in a fixed position in the operating chamber for a predetermined time. The low pressure serves to eliminate airborne impurities from the chamber. After the two preceding cleaning steps, the top surface 12 and the edge surface 14 of the metallic plate 10 are ready for additional surface treatment.

Figure 2:
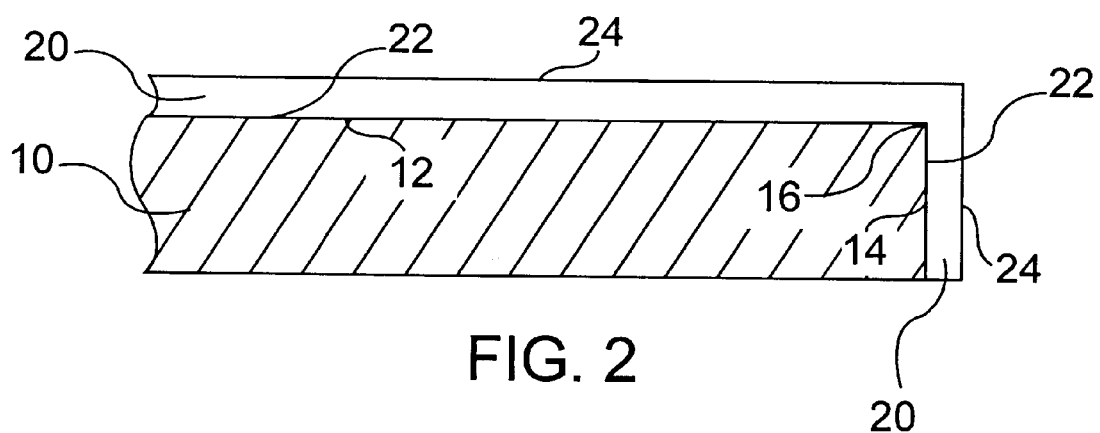
FIG. 2 depicts FIG. 1 with an added mineral layer.

FIG. 2 illustrates FIG. 1 after a mineral layer 20 is formed on the top surface 12, and on the edge surface 14, of the metallic plate 10. The mineral layer 20 includes a chemical compound derived from a mineral; e.g., silicon dioxide ($SiO_2$) derived from quartz. Such chemical compounds include, inter alia, silicon dioxide, silicon nitride, and silicon carbide. The chemical compound may exist in either crystalline or amorphous form. The mineral layer 20 has a bottom surface 22 that is bonded to the top surface 12, and the edge surface 14, of the metallic plate 10. A top surface 24 of the mineral layer 20 is exposed.

It is within the scope of the present invention to have embodiments in which the mineral layer 20 covers the entire top surface 12, or a portion of the top surface 12, without covering any portion of the edge surface 14. Nonetheless, it is preferred that the mineral layer 20 cover the entire top surface 12 as well as the edge surface 14, as shown in FIG. 2. With the mineral layer 20 covering the entire top surface 12, the additional coverage of the edge surface 14 prevents a high concentration of stress at the corner 16 of the metallic plate 10 when the metallic plate 10 is subsequently adhesively coupled to an electronic carrier.

Figure 3:
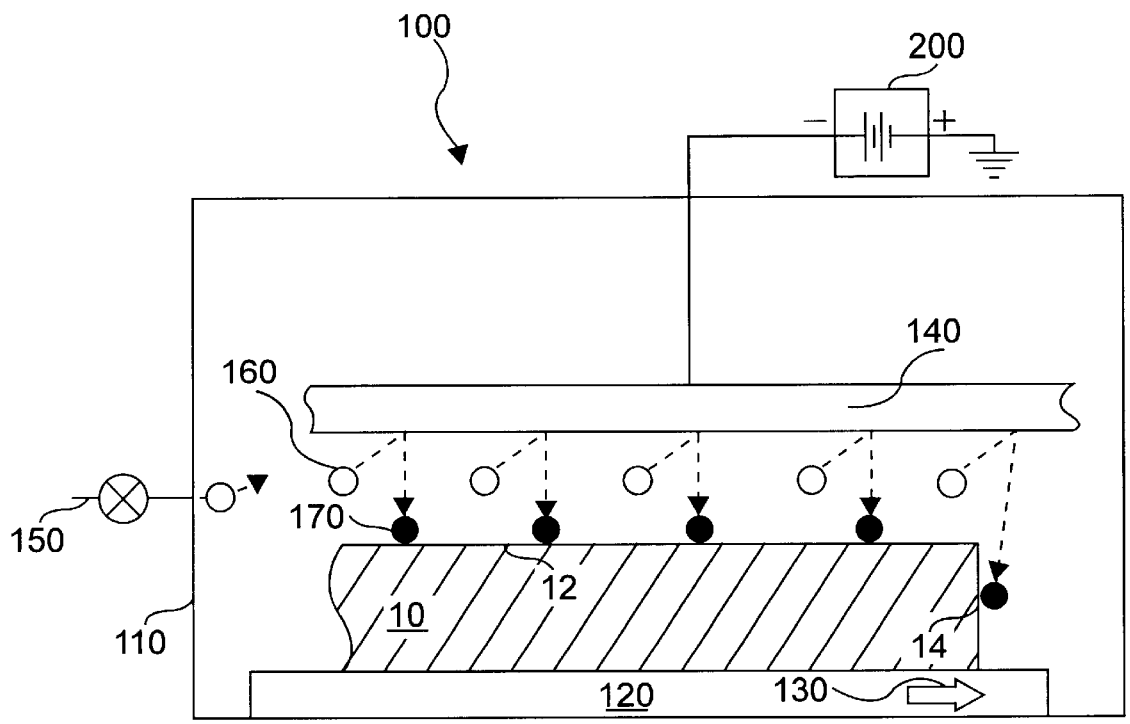
FIG. 3 depicts a sputtering deposition chamber, in accordance with the preferred embodiment.

Any known process may be used to form the mineral layer 20 on the metallic plate 10. FIG. 3 illustrates such a process, namely the process of sputter deposition of mineral molecules 170, such as $SiO_2$, on the top surface 12 of the metallic plate 10, as well as on the edge surface 14 of the metallic plate 10. FIG. 3 shows a simplified sputter deposition chamber 100 with an enclosure 110. The sputter deposition chamber 100 illustrated in FIG. 3 includes a target of quartz 140, which serves as a source of $SiO_2$ molecules. Initially, the sputter deposition chamber 100l is evacuated to remove impurities. A gas inlet 150 allows an argon (Ar) gas 160 (or other applicable gas such as $O_2$) to pass into the sputter deposition chamber 100. The argon gas 160 is ionized and accelerated by processes induced by negative voltage source 200, such that energetic argon ions strike the quartz target 140, causing $SiO_2$ molecules 170 to be dislodged and ejected from the quartz target 140 and then deposited on the top surface 12 of the metallic plate 10. The metallic plate 10 moves through the sputtering deposition chamber 100 on a conveyor belt 120 in the direction 130. Alternatively, the conveyor belt 120 could represent a stationary platform such that the sputtering deposition process is turned off after a predetermined period of time.

The sputtering deposition process should be adjusted to deposit a mineral layer having a minimum layer thickness of about 50 Å to ensure continuous coverage of the top surface 12, and of the edge surface 14, of the metallic plate 10. The maximum thickness of the mineral layer depends on molecular structural properties of the pertinent chemical compound in the mineral layer. For example, a mineral layer thickness of up to about 2000 Å protects the structural integrity of a quartz layer containing crystalline $SiO_2$. A quartz layer thickness between about 100 Å and about 1000 Å is preferred for reasons of conservatism.

Figure 4:
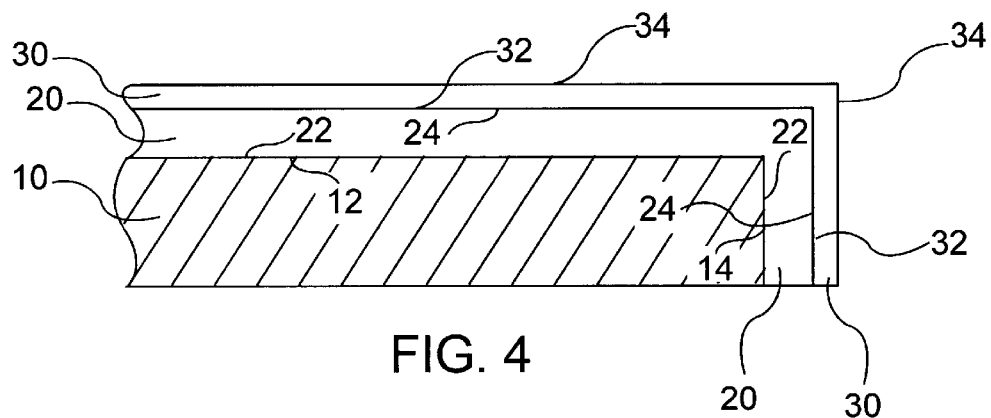
FIG. 4 depicts FIG. 2 with an added adhesion promoter layer.

FIG. 4 illustrates FIG. 2 after treatment with an adhesion promoter, such as a silane, to form an adhesion promoter layer 30 on the mineral layer 20. The lower surface 32 of the adhesion promoter layer 30 is bonded to the upper surface 24 of the mineral layer 20. The adhesion promoter layer 30 may be formed with an approximately uniform thickness by any process known in the art. For example, the $SiO_2$-covered metallic plate 10 may be dipped in a silane solution, followed by dripping off excess solution and drying for several minutes at a moderate temperature (e.g., drying for 15 to 20 minutes at 80 to 100° C.). The adhesion promoter layer 30 should be thin enough to promote good adhesion with a subsequently applied structural adhesive. In particular, the thickness of the adhesion promoter layer 30 should be between 1 and about 50 monolayers. The adhesion promoter may include, inter alia, any silane adhesion promoter. See Plueddemann, "Silane Coupling Agents," Plenum Press, 1982. For example, the applicable classes of silane adhesion promoters include:

| Class | Example |
| --- | --- |
| E-P-Si-$(OCH_3)_3$ | 3-glycidoxypropyltrimethoxysilane |
| E-P-Si-$(OC_2H_5)_3$ | 3-glycidoxypropyltriethoxysilane |
| A-P-Si-$(OCH_3)_3$ | 3-(2-aminoethyl)propyltrimethoxysilane |
| A-P-Si-$(OC_2H_5)_3$ | 3-(2-aminoethyl)propyltriethoxysilane | where P stands for a propyl group, E stands for an epoxy group, and A stands for an amino group. The choice of an E or A in the preceding silane classes impacts the conditions under which the silane reacts when placed in contact with a structural epoxy material (see infra discussion of FIG. 5 concerning use of a structural epoxy adhesive for bonding the metallic plate of the present invention with an electronic assembly such as a chip). For example, the glycidoxy group will react with a curing agent in the structural epoxy material so that an elevated temperature may be required to drive the reaction, depending on the properties of the curing agent. In contrast, the aminoethyl group is itself a curing agent which will react with epoxy material at room temperature. Additional adhesion promoters which may be used for the present invention include titanates, zirconates, and aluminates.

The presence of the mineral layer 20 between the metallic plate 10 and the adhesion promoter layer 30 facilitates strong chemical coupling of the adhesion promoter layer 30 to the metallic plate 10. With the related art, there is no intervening mineral layer. Thus, in the related art, an adhesion promoter (e.g., a silane) is formed directly on a metallic plate (e.g., a stainless steel plate) with a chemical bond having a strong ionic character between the metallic plate and the adhesion promoter. Such chemical bonding is subject to hydrolysis and is therefore weak in the presence of moisture. With the mineral layer 20 of the present invention, however, covalent bonding exists between the mineral layer 20 and the added adhesion promoter, such as between $SiO_2$ and silane. Such covalent bonding is moisture resistant. Thus, the structure of the present invention is not subject to degradation in the presence of moisture.

FIG. 5 illustrates FIG. 4 after the metallic plate 10 is adhesively coupled to an electronic assembly-carrier configuration, comprising an electronic assembly coupled to an electronic carrier, such as the module 80. The module 80 includes a chip 50 and a chip carrier 60, wherein the chip 50 is electrically coupled to the chip carrier 60 by C4 solder balls 55. A rigid thermoset encapsulating material 58 provides strong mechanical coupling between the chip 50 and the chip carrier 60. A ball grid array 66 at the bottom surface 64 of the chip carrier 60 facilitates subsequent attachment of the module 80 to a second electronic carrier such as a circuit card. The metallic plate 10 is adhesively coupled to the module 80 by the adhesive structure 40 which couples the top surface 34 of the adhesion promoter layer 30 to the top surface 52 of the chip 50 and to the top surface 62 of the chip carrier 60. Such adhesive coupling may be accomplished by any known process. An applicable process includes using a structural epoxy adhesive to accomplish the adhesive bonding, after surface treating with silane both the top surface 52 of the chip 50 and the top surface 62 of the chip carrier 60. The structural epoxy adhesive becomes, after curing, the adhesive structure 40.

The effectiveness of the mineral layer for promoting adhesion between a stainless steel plate and an applied epoxy adhesive was demonstrated by a wedge test. A pre-test phase was initiated by chemically treating a 7-mil thick stainless steel plate to remove organic contaminants. A layer of stainless steel was then removed from the plate by radio-frequency etching, using a high-energy argon gas in a low-pressure (about $2 \times 10^{-4}$ psi) etch chamber. The removed layer thickness varied between about 300 Å and about 800 Å. The preceding chemical cleaning and etching steps served to provide a clean and bondable surface on the stainless steel plate. Next, a uniform layer of $SiO_2$ was sputter deposited on the clean surface of the stainless steel plate by using argon gas in a sputtering deposition chamber while moving the plate on a conveyor belt through the chamber at constant velocity. The thickness of the $SiO_2$ layer was varied between about 300 Å and about 600 Å. After being cooled to about 100° C. by circulating nitrogen gas, the plate was dipped into a dilute solution (i.e., less than 2%) of either the silane 3-glycidoxypropyltrimethoxysilane or the silane 3-(2-aminoethyl)propyltrimethoxysilane. Excess silane was dripped off and the adherent silane was bake-dried in a chamber at 80 to 90° C. for about 15 to 20 minutes. The resultant plate, after the aforementioned pre-test treatment, will be referred to as a "test plate." "Control test plates" were also generated in the same manner as described above with omission of the $SiO_2$ sputter deposition step.

Figure 6:
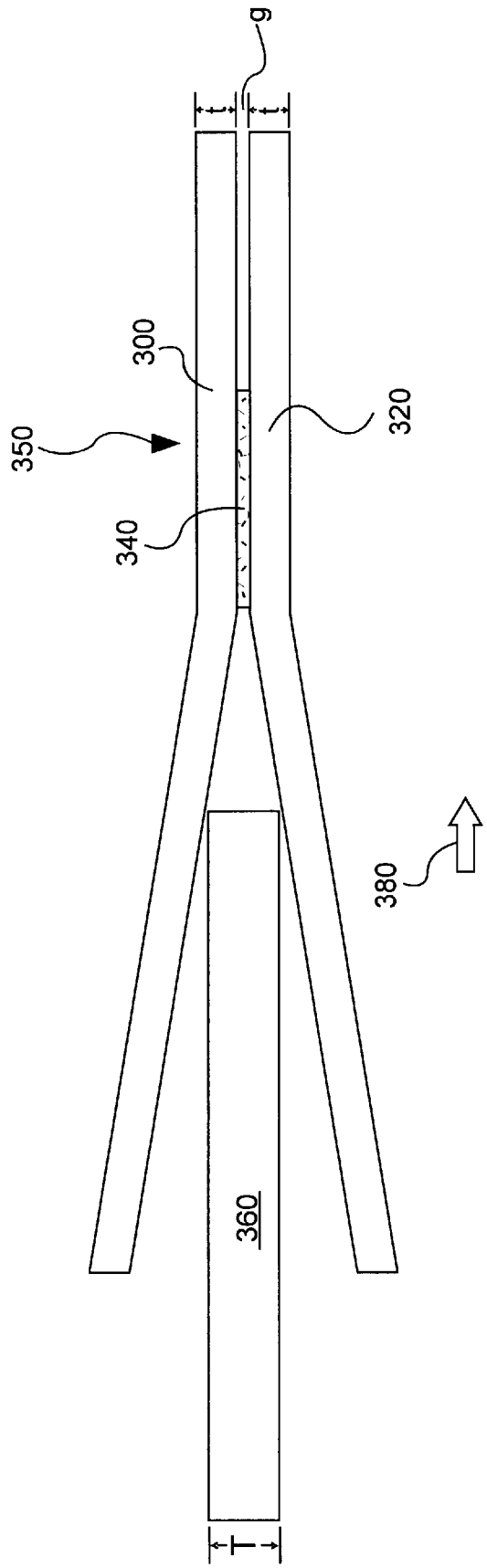
FIG. 6 depicts the configuration of a wedge test.

In the wedge test, as depicted in FIG. 6, a first test plate 300 was mechanically bonded to a second test plate 320 in a sandwich, using an interfacing adhesive layer 340 that included a structural adhesive, resulting in a bonded configuration 350. The first test plate 300 and second test plate 320 each had a thickness (t) of about 7 mils and were separated in the bonded configuration by a gap size (g) of about 4 mils. After the epoxy adhesive 340 was cured, a wedge plate 360, having a thickness (T) of about 12 mils, was inserted as a wedge between the first test plate 300 and the second test plate 320 and stressed the interfacial bonding between the first test plate 300 and the second test plate 320 by generating a crack opening energy of about 50 Joules/$m^2$. Under the stress due to the wedge plate 360, the bonded configuration 350 was aged for 24 hours at a temperature of 70° C. and a relative humidity of 60%, in order to simulate and accelerate the effects of realistic thermal loads that ordinarily occur in operating electronic packages. Next, the wedge plate 360 was removed and the interfacing adhesive layer 340 of the bonded configuration 350 was subjected stresses that included the combined effects of excessive moisture, mechanical stress, thermal cycling, and vapor pressure. The preceding stresses were generated in three sequential steps: a baking step, a soaking step, and a heating step. In the baking step, the bonded configuration 350 was baked at a temperature of 125° C. for 24 hours in order to drive moisture out of the bonded configuration 350. In the soaking step, the bonded configuration 350 was subjected to a relative humidity of 85% at a temperature of 85° C. The excess moisture tends to penetrate and soften the interfacing adhesive layer 340. In the heating step, the wedge plate 360 was reinserted, so as to introduce mechanical stress at a crack opening energy of about 3 Joules/$m^2$, followed by three successive heating cycles. In each heating cycle, the bonded configuration 350 was heated to an elevated temperature exceeding 200° C., maintained at the elevated temperature for about one minute, and cooled to ambient room temperature after removal from the heat source. The heating cycles stressed the adhesive bonding in the bonded configuration 350 by increasing the CTE, and decreasing the elastic modulus, of the adhesive. The heating cycles also vaporized excess moisture within the interfacing adhesive layer 340, thereby creating a vapor pressure that further stressed the interfacing adhesive layer 340.

A "peeling" step was used to test the resulting strength of the interfacing adhesive layer 340 after application of the preceding stresses. In particular, force was applied to the wedge plate 360 to move the wedge plate 360 in the direction 380 toward the interfacing adhesive layer 340 until the first test plate 300 and the second test plate 320 separated. The surfaces of the first test plate 300 and the second test plate 320 were examined to determine the percentage (P) of the adhesive-covered area of a given test plate (300 or 320) that became adhesive free upon separation from the other test plate. The test "failed" if P exceeded 30% for at least one of the first test plate 300 and the second test plate 320; otherwise the test "passed." When the test was performed 4 times with 4 identical samples each time, and regular test plates (i.e., $SiO_2$ layer present) were used, the test always passed. Indeed, P was 0% for each sample, regardless of which silane (3-glycidoxypropyltrimethoxysilane or 3-(2-aminoethyl)propyltrimethoxysilane) was used. In contrast, when the control test was performed 7 times with 4 identical samples each time, using control test plates (i.e., no SiO$_2$ layer present), the test always failed when 3-glycidoxypropyltrimethoxysilane was used and failed about 50% of the time when 3-(2-aminoethyl) propyltrimethoxysilane was used. Thus, the preceding wedge test results demonstrate the effectiveness of the mineral layer (e.g., SiO$_2$ layer) of the present invention for promoting and maintaining strong adhesive bonding with a silane-treated metallic plate.

It is also noteworthy that the epoxy bond associated with the present invention was able to withstand a tensile stress of up to about 10,000 psi in another test, namely a stud pull test. In the stud pull test, the head of a stud was bonded with a test plate, using an epoxy adhesive. Tensile stresses of increasing magnitude were applied in an attempt to pull the stud away from the test plate, until the stud separated from the test plate. The test was performed for 24 test plates, corresponding to the etch thicknesses and sputter deposit thicknesses associated with test runs 1–6 in the preceding table and with 4 samples for each test run. The amount of tensile stress required to effectuate the stud separation varied from 9380 psi to 11120 psi for the 24 test plates. Of particular significance is that for all 24 test plates, the epoxy layer was fractured at the onset of stud separation and the SiO$_2$ layer was left intact.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
    a metallic plate;
    a mineral layer bonded to the metallic plate; and
    an adhesion promoter layer bonded to the mineral layer.

2. The structure of claim 1, wherein the mineral layer includes a mineral selected from the group consisting of silicon dioxide, silicon nitride, and silicon carbide.

3. The structure of claim 1, wherein the mineral layer has a thickness between about 50 angstroms and about 2000 angstroms.

4. The structure of claim 1, wherein the metallic plate includes a metallic substance selected from the group consisting of stainless steel, aluminum, titanium, copper, copper coated with nickel, and copper coated with chrome.

5. The structure of claim 1, wherein the adhesion promoter layer includes an adhesion promoter selected from the group consisting of a silane, a titanate, a zirconate, and an aluminate.

6. The structure of claim 1, wherein the adhesion promoter layer includes a silane selected from the group consisting of 3-glycidoxypropyltrimethoxysilane, 3-glycidoxypropyltriethoxysilane, 3-(2-aminoethyl) propyltrimethoxysilane, and 3-(2-aminoethyl) propyltriethoxysilane.

7. The structure of claim 1, further comprising:
    an electronic carrier;
    an electronic assembly coupled to the electronic carrier; and
    an adhesive structure bonded to the adhesion promoter layer, wherein the adhesive structure adhesively couples the metallic plate to the electronic assembly, and wherein the adhesive structure adhesively couples the metallic plate to the electronic carrier.

8. The structure of claim 1, wherein the adhesion promoter layer is bonded to a structural adhesive.

9. The structure of claim 1, wherein the adhesion promoter layer has a thickness between 1 monolayer and about 50 monolayers.

10. The structure of claim 7, wherein the adhesive structure includes a structural epoxy adhesive.

11. The structure of claim 7, wherein a coefficient of thermal expansion (CTE) of the metallic plate exceeds a CTE of the electronic assembly.

12. An electronic structure, comprising a mineral layer bonded to a metallic plate and covalently bonded to an adhesion promoter layer.

13. An electronic structure, comprising a mineral layer bonded to a metallic plate and to an adhesion promoter layer, wherein the adhesion promoter layer is adapted to be bonded to a structural adhesive.

* * * * *